(12) United States Patent
Breiner et al.

(10) Patent No.: US 6,298,470 B1
(45) Date of Patent: Oct. 2, 2001

(54) METHOD FOR EFFICIENT MANUFACTURING OF INTEGRATED CIRCUITS

(75) Inventors: Lyle Breiner, Meridian, ID (US); Randhir P. S. Thakur, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/292,215

(22) Filed: Apr. 15, 1999

(51) Int. Cl.[7] .................................................. G06F 17/50
(52) U.S. Cl. .................................................................. 716/4
(58) Field of Search ..................................................... 716/4

(56) References Cited

U.S. PATENT DOCUMENTS

| | | | |
|---|---|---|---|
| 4,215,396 | 7/1980 | Henry et al. | 716/10 |
| 4,215,398 | 7/1980 | Burkett et al. | 700/9 |
| 4,293,249 | 10/1981 | Whelan | 406/72 |
| 5,526,296 | 6/1996 | Nakahara et al. | 708/209 |
| 5,642,296 | 6/1997 | Saxena | 716/4 |
| 5,646,870 * | 7/1997 | Krivokapic et al. | 716/4 |
| 5,659,467 | 8/1997 | Vickers | 700/9 |
| 5,661,669 | 8/1997 | Mozumder et al. | 716/19 |

* cited by examiner

Primary Examiner—Trong Phan
(74) Attorney, Agent, or Firm—O'Keefe, Egan & Peterman, LLP (57) ABSTRACT

This invention pertains to a method for the systematic development of integrated chip technology. The method may include obtaining empirical data of parameters for an existing integrated circuit manufacturing process and extrapolating the known data to a new technology to assess potential yields of the new technology from the known process. Further, process variables of the new process may be adjusted based upon the empirical data in order to optimize the yields of the new technology. A logic based computing system such as a fuzzy logic or neural-network system may be utilized. The computing system may also be utilized to improve the yields of an existing manufacturing process by adjust process variables within downstream process tools based upon data collected in upstream process for a particular semiconductor substrate or lot.

21 Claims, 5 Drawing Sheets

METHOD FOR EFFICIENT MANUFACTURING OF INTEGRATED CIRCUITS

BACKGROUND OF INVENTION

This invention relates to automated manufacturing of integrated circuits, and more particularly to a method of utilizing automated process control to characterize and implement both new generation processes and existing generation processes.

The process of manufacturing an integrated circuit is highly complex and requires hundreds of process steps to convert a semiconductor material to a working integrated circuit. To implement an integrated circuit manufacturing process, enormous capital expenditures are required to build the manufacturing facility (a "fab"). In addition, to remain competitive in the marketplace a manufacturer of integrated circuits must rapidly develop new generations of design and process technologies. For example, present turnaround time for DRAM type technology is three years or less. Accordingly, process development time is a critical factor in such environments, and thus, the development and transfer of newly developed technology to volume manufacturing should be as rapid as possible. Further, once a new technology has reached volume production, there remains a need for optimizing the efficiencies of the manufacturing operation in order to obtain the highest process yields possible. The inventors herein have observed that a need exists for a method of systematically developing new manufacturing technology and systematic methods to apply such technology to a high volume manufacturing operation. The inventors herein have also observed that a need exists for a method for improving the efficiencies of the manufacturing technology even after the technology has been implemented in a manufacturing operation.

SUMMARY OF INVENTION

The present invention provides an improved method of utilizing automated process control techniques to characterize and implement both new and existing generation integrated circuit manufacturing processes.

In one broad respect, this invention provides a method for the systematic development of integrated chip technology. The method may include obtaining empirical data relating to process variables of an existing integrated circuit manufacturing process to characterize the existing integrated circuit manufacturing process and extrapolating, with a logic based computer system, the existing data to a new process technology to assess and calculate variations between the known process and a new integrated circuit manufacturing process. The method may further include determining potential yields of the new process and adjusting process variables of the new process to conform to a desired yield model through the use of the logic based computer system. Generally, the process parameters chosen for adjustment will be those parameters that are determined to significantly affect the manufacturing process and quality of integrated circuits made by the process.

In another broad respect, this invention is a method for developing a new integrated circuit fabrication process. The method may comprise selecting a known integrated circuit fabrication process defined by a given set of design rules, identifying key process steps use in the known process and comparing the known process design rules with design rules for the new integrated chip fabrication process. The method may further include preparing a statistical model for the new fabrication process and defining factors causing potential yield loss in the new process. The method may further include defining control limits on the potential variations in the new integrated circuit fabrication technology based on known the process, computing shifts in yield in the new process due to the potential variations in the process variables of the new integrated circuit fabrication technology and adjusting the control limits to improve yield. In certain embodiments, the method may also comprise repeating at least some of the steps of the method to achieve the desired yield. The selection of control limits for selected process parameters will typically be based on 6-sigma statistical limits of known variations from the known process.

In a third broad respect, this invention is a system useful for manufacturing an integrated circuit. The system may include a plurality of process tools used in making the integrated circuit. Further, the system may include a logic based computer system and process control software installed in or coupled to each manufacturing tool, the computer system and control software monitoring and controlling the operation of at least some of the tools, wherein process variables of a plurality of downstream process tools are automatically adjusted by the computer system and control software to improve integrated circuit yield based on a comparison of previously obtained process variables occurring from one or more upstream process tools. In addition, the system may include lines for networking the computer system to a plurality of the process tools.

In yet another broad respect, a process useful for the manufacture of an integrated circuit is provided. The process may include introducing a semiconductor substrate into a manufacturing line used to make an integrated circuit and processing the substrate using process tools of the manufacturing line. In addition, the process may include obtaining first process data relating to the processing of the first substrate through at least a first process tool, identifying variations in the first process data as compared to desired first process data, and automatically adjusting through a logic based computer system one or more process variables of at least a first downstream process tool in order to compensate for the identified variation.

Representative examples of process output data or variables monitored may include those related to thickness, surface and design defects, reflectivity, etch rates, polish rates, photolithographic characteristics, electrical characteristics, tool characteristics, etc. Non-uniformities may be monitored within a wafer, wafer to wafer, and run to run. In some methods, the relationship between yield and selected process parameters will fit into a polynomial, such as $Y(yield)=A_1+A_2X_1+A_3X_2^2+\ldots A_nX_{n-1}^{n-1}$ wherein the distribution of each term $A_nX_{n-1}$ is determined where $A_nX_{n-1}$ for a given process step is the acceptable variation ($f(x)$) of previous and future steps.

It should be appreciated that the methods of this invention are largely empirical in nature, since response parameters are collected from previous generation IC manufacturing technology and are then applied to the new generation IC technology. The methods herein are useful in a variety of manufacturing operations. For example, the methods are useful in the manufacture of integrated circuit memories, such as for example, DRAM products. Representative examples of well known IC technology from which models for new technology can be extrapolated from includes 0.25 micron DRAM technology, 0.18 micron DRAM technology or other generations of technology.

The present invention provides significant advantages in a manufacturing operation where time for development and implementation of new technology is limited. For example, this method enables new IC technology to be converted into a volume manufacturing operation in reduced time relative to present methods used to design and implement new process technology. Furthermore, this invention reduces scrap, misprocessing and the like, which are commonly associated with converting a new IC manufacturing technology into a commercially viable high-volume manufacturing process.

DETAILED DESCRIPTION OF THE INVENTION

As described above, this invention generally relates to methods for efficient integrated circuit manufacturing. During the practice of this invention, computer analysis and feedback of process variables of an integrated circuit manufacturing technology may be provided. Various process conditions and variables associated with the technology may be adjusted based on such analysis and feedback in an effort to reach the desired yield and product performance. In this regard, this invention may employ smart control systems, such as but not limited to fuzzy logic or neural-network based computer control algorithms. Such computer (or logic) based algorithms are well known, with a variety of such systems and programs being commercially available. As an alternative to selecting a commercial software package, a system can be readily designed and written using standard computer programming techniques.

This invention may be utilized with of a variety of known semiconductor process tools (manufacturing equipment). These tools may include, for example, diffusion furnaces, oxidation chambers, chemical vapor deposition (CVD) systems, rapid thermal processing tools and other deposition tools, photolithography tools, etch tools, ion implant tools, planarization tools, cleaning tools, etc. These tools may be utilized for producing a variety of patterned conductor and insulator layers on a semiconductor substrate as is common in semiconductor fabrication. The tools may include distributed computer based control algorithms (algorithms residing in each tool) and the control systems associated with individual tools may be coupled together through a computer network. Alternatively, the computer based control algorithms may be incorporated within a central computer system which is coupled to each tool with control software. In yet another approach, a combination of distributed and centralized control systems may be utilized. The logic-based control system of this invention has the capability of collecting extensive data from a wide variety of process steps in a fabrication process. As described below in more detail, the collected data may be utilized in controlling and optimizing an existing process. Further, the collected data may be utilized for designing and characterizing new processes based on the characterization data from an old process in order to more easily meet a desired yield model for the new process.

The data collected by the control system of this invention may include data obtained from in-process semiconductor wafers and/or data collected from the various process tools. Numerous examples of the types of data that may be collected are listed below. However, the list set forth below is meant to be illustrative only and is not limiting as to the types of data that may be obtained and utilized with the techniques that will be described herein. The data collected from the semiconductor wafers may include data collected from the wafers containing the actual in-process integrated circuit or from test/dummy wafers processed with the in-process integrated circuit wafers or processed in some predetermined time proximity as compared to the in-process integrated circuit wafers. Moreover, the wafer data may be collected at any number of points in the fabrication process. Examples of data collected from the wafers may include, but are not limited to:

1. initial wafer characteristics such as initial resistivity, oxygen content, wafer thickness, wafer flatness, etc.;
2. characteristics of grown or deposited materials (for example, oxides, metals, suicides, nitrides, polysilicon, polyimides, other conductors, other dielectrics, etc.) such as thickness, reflectivity, index of refraction, resistivity, surface roughness, grain size, defect and/or highlight density, step coverage, etc.;
3. photolithography measurements such as photoresist thickness, wafer reflectivity after photoresist coating, after-develop critical dimensions, after-develop resist slope, etc.;
4. etch (wet or dry) measurements such as the amount of a layer to be etched that has been removed, amount of removal of an etch stop layer, pre-etch and post-etch thicknesses of various layers, amount of photoresist removed during etch, post-etch critical dimensions, etch rates, post-etch conductor resistance, post-etch conductor continuity, post-etch conductor shorts, etc.;
5. chemical mechanical polishing measurements such as polishing removal rates, amount of material removed, post-polish thickness, defect and/or highlight density, etc.;
6. implant measurements such as post-implant resistivity, peak implant depth, implant profile, etc.;
7. defect density data such as the amount and size of defects contributed by each process step, the source of such defects, and the impact of changes in process variables upon such defects;
8. electrical test measurements on characterization structures such as threshold voltages, breakdown voltages, punch through voltages, leakage currents, line width, resistivity, capacitance, etc. and wafer map data of the same;
9. wafer probe data including pre- and post-repair data for total yield, identification and quantification of failed tests, actual electrical values obtained for good die and failed die, etc. and wafer map data of the same; and
10. physical and electrical design rules for the particular integrated circuit device being manufactured.

The wafer data may be collected and tracked on a per wafer basis, per lot basis, per process run basis or combinations thereof. Further, the data may include multiple measurements for each data point, mean values, median values, range of values, standard deviations, wafer maps of the collected data, etc.

The data collected from the process tools may be even more extensive. Such data may include, but is not limited to:

1. data relating to the tool identity such as the manufacturer, model number, machine or serial number;
2. data relating to the particular portion of a process tool utilized to process a semiconductor substrate such as the process chamber, tank number, furnace number, track number, station number, etc.;
3. data relating to the particular process utilized such as the recipe number, process number, program number, etc.;
4. data relating to the conditions the semiconductor substrate is processed under at a specific process step such as wet clean times, wet clean temperatures, spin speeds, wet and dry etch times, implant species, implant energy, implant dose, bake time, bake temperature, strip times, photoresist coat and develop times and temperatures, photolithography exposure times and energy, deposition temperatures, slurry temperatures, polish speeds, polish force, furnace zone number, anneal times, etc.
5. data relating to the internal process tool conditions such as temperatures, speeds, gases, gas flow rates, gas temperatures, liquid flow rates, liquid temperatures, temperature ramp times, pressures, rf power, energy levels, numerical aperature settings, etc.; and
6. data relating to equipment maintenance and quality such as time or number of runs from the last calibration, calibration data, time or number of runs from the last clean, time or number of runs from the last overhaul, defect monitor readings, test wafer uniformity readings, etc.

The tool data may be collected and tracked on a per wafer basis (for single wafer tools), per lot basis, per process run basis or combinations thereof. In addition, the data may include multiple measurements for each data point, mean values, median values, range of values, standard deviations, wafer maps of the collected data, etc.

Figure 1:
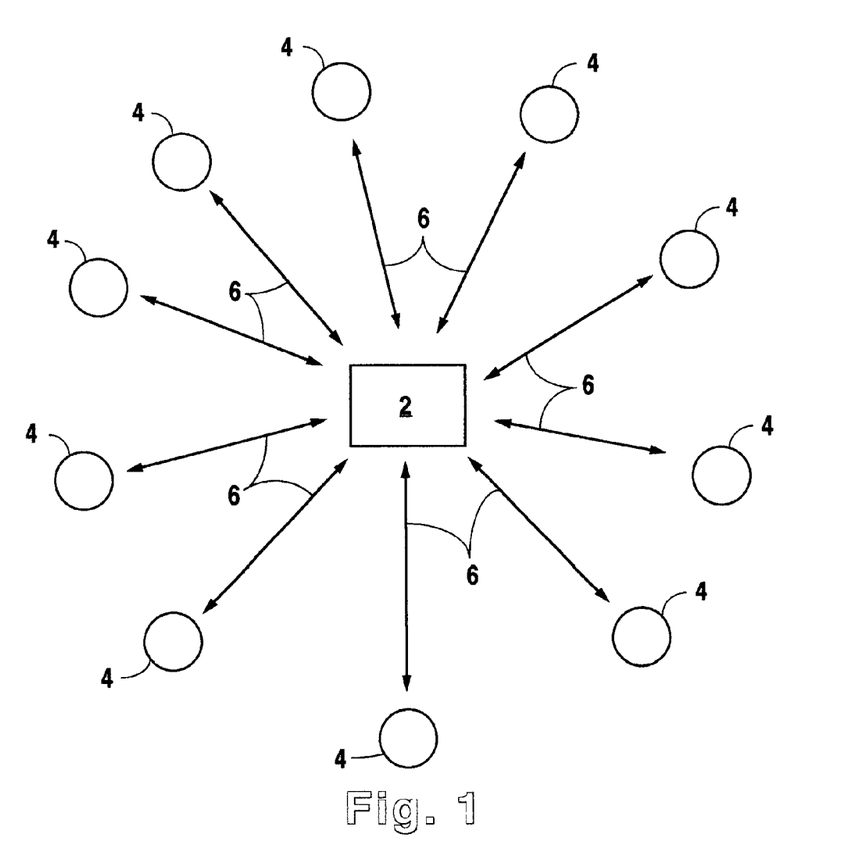
FIG. 1 shows a conceptual block diagram of a manufacturing facility utilizing the process control and development techniques disclosed herein.

Furthermore, the process tool data and the wafer data may be correlated and tabulated together. Thus, an informational data base may be established containing all key data relating to the entire semiconductor fabrication process. Utilizing smart control and/or analysis systems, such as fuzzy logic or neural-network systems, the informational data base may then be utilized to establish yield models, improve existing yields, identify critical yield factors, define process limits for new processes, identify expected yield models for new processes, etc. FIG. 1 illustrates a block diagram of the equipment utilized to perform the techniques shown herein. As shown in FIG. 1, a logic based computer system 2 may be provided (the exemplary embodiment being a centralized computer system). The logic based computer system 2, interacts with a wide variety of process tools 4 utilized in the manufacturing flow of an integrated circuit manufacturing process. The process tools 4 may be tools which actually add, remove, clean, heat, or modify layers of material upon a semiconductor substrate. The process tools 4 may also include metrology tools used to measure or monitor physical or electrical parameters of the semiconductor substrate. Information is passed between the process tools 4 and the computer system 2 through data lines 6. The process tools 4 generally interact with the logic based computer system 2 by providing collected process data to the computer system 2 while the computer system 2 provides control information to the process tools. Though each data line 6 shown in FIG. 1 includes a bidirectional flow of information, some process tools may only receive control information or alternatively some process tools may only transmit collected process data. Furthermore, though described herein with respect to each process tool 4 being a separate process tool, the individual process tools 4 may be sub-parts of a single process tool. Thus, for example, each process chamber of a multi-chambered process tool may be construed as a different process tool 4 when construing FIG. 1.

Control and Optimization Within A Single Process

As mentioned above the data collection and analysis techniques disclosed herein may be utilized for both controlling and optimizing an existing fabrication process. The following examples of such control and/or optimization techniques are illustrative and the scope of the present disclosure is not limited to these examples.

In one example of process control, the logic based computer control system has the capability to detect variations in an individual process step. Such detection may be, for example, by the use of in-situ metrology and monitoring techniques. The logic based control system may also force a given manufacturing device to automatically employ different operating conditions to thereby adjust the device to control a selected variable independent of any external adjustment. For instance, if a polysilicon deposition tool initially used the wrong process recipe (e.g., one that will result in a target thickness of 1000 Angstroms instead of the desired 500 Angstroms), the computer control system may detect that the thickness that will result from the use of such process recipe will result in an error (or variation) outside the desired limits for the specific integrated circuit product being manufactured. The system may then automatically correct the process recipe, or notify an operator if automatic correction is unavailable.

In another example (again using a polysilicon deposition thickness for illustrative purposes), various process variables of the polysilicon deposition tool, such as gas flow rates, temperatures, pressures, etc., may be in-situ monitored. The logic based computer control system may then determine that the selected process parameters will result in a polysilicon thickness outside of a desired range (for example a six sigma statistical process control limit). Based upon the informational database, the process control system may then adjust the necessary variables in-situ to achieve the desired polysilicon thickness.

The examples discussed above relate to the use of the control system within a single process tool or process step. However, one aspect of the present invention is the capability to identify errors or variations through a control system which flags the error or variation and associates such error or variation with a given wafer or lot. Then as the wafer or lot having the error or variation is processed through the entire fabrication line, the logic based system may automatically adjust process conditions downstream of where the error or variation occurs for that wafer or lot. Moreover, the automatic adjustments need not only be performed when the variation is outside of desired process control limits, but may also be performed to deal with smaller variations within the process control limits. The downstream adjustments performed may be very small in some cases, however, such adjustments may better optimize ultimate yield and performance. Moreover, the yield impact of making such adjustments at numerous process steps based upon numerous previous process and metrology steps may be much greater than the impact of automatically controlling a single tool. Thus, one, two, three, four or more previous process variations may all be considered in determining the adjustments made to one downstream process step. Also, variations in one previous step may result in adjustments to one, two, three, four or more downstream process steps. Further, the information database and logic based control system may be utilized to monitor numerous or all previous process steps to provide adjustments to numerous downstream process steps. Thus, logic based systems such as fuzzy logic systems or neural-networks may process large quantities of historical information for a given semiconductor wafer or lot to continuously adjust or fine-tune any or all subsequent process steps to achieve an optimal yield. In this manner the yield improvement techniques disclosed herein address not only the operation of individual tools in the manufacturing process, but they may also coordinate the operation of the entire set of tools to optimize the overall performance of the process.

For instance, if a polysilicon deposition operation results in a deposition thickness of 450 Angstroms instead of a desired 500 Angstroms a number of downstream process steps may be adjusted to compensate for the variation. Thus, a subsequent process step in which the polysilicon was to be oxidized may be shortened so that an oxide grown on the polysilicon is reduced in thickness so that the resulting thickness of the polysilicon after oxidation more closely resembles the desired thickness. Further, reflectivity variation that may result from the variation in the polysilicon thickness may be compensated for in a downstream photolithography step. Thus, the photolithography exposure time or intensity used to pattern the photoresist upon the polysilicon may be automatically adjusted upwardly or downwardly so as to compensate for the variation in reflectivity. Similarly, the electrical characteristics of the thinner polysilicon layer may require a change in the critical dimension (CDs) target utilized to pattern the polysilicon layer. Yet another downstream process step which may be adjusted would be an etch of the polysilicon layer. Because the polysilicon layer is thinner, the logic based process control system may automatically adjust the etch time (for instance a main etch time and/or an overetch time) of the etch tool used to etch the polysilicon layer.

Numerous other process variations may be utilized to change downstream variables. A sampling of such variations and changes includes:

1. changes made to gate critical dimensions to compensate for variations in threshold voltage implant variations;
2. changes in photolithography exposure levels to compensate for variations in polysilicon grain structure;
3. changes in plasma etch times to compensate for variations in photolithography after develop critical dimensions;
4. changes in photolithography exposure does and changes in develop time to compensate for resist thickness;
5. changes in implant energy or dose to compensate for field oxide thickness (or vice-versa);
6. changes in chemical mechanical polish times to compensate for oxide thickness;
7. changes in gate critical dimensions to compensate for gate oxide thickness;
8. changes to etch times to compensate for metal thickness; and
9. changes to photolithography exposure times and polysilicon etch times to compensate for polysilicon thickness variations.

It will be recognized by those skilled in the art that numerous other process variables dependencies will exist in addition to those described herein, and the concepts disclosed herein are not limited to the examples shown. Further, the dependencies may be more complex in which two, three or more process variables effect two three or more downstream variables.

Figure 2:
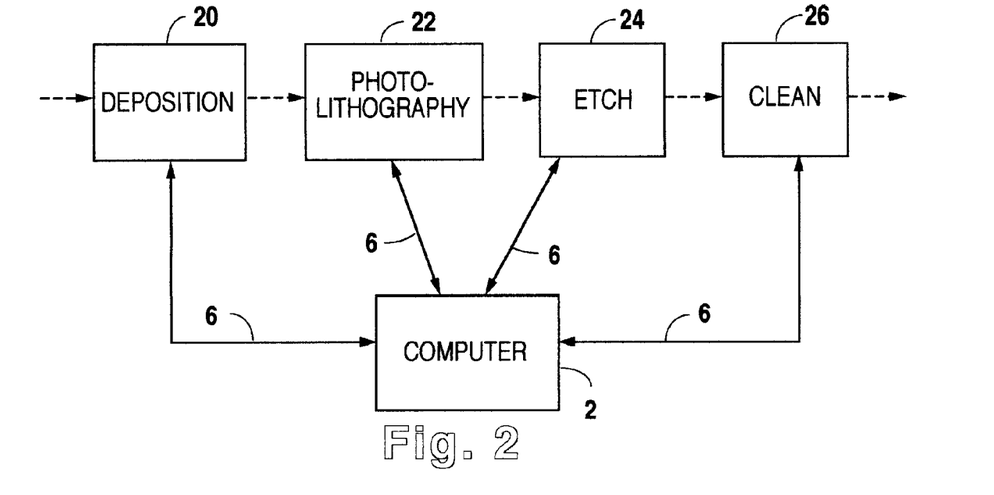
FIG. 2 is a flow diagram illustrating process control across an existing manufacturing line.

In FIG. 2 a representative smart, logic based system according to this invention is shown for use with a segment of a standard integrated circuit manufacturing flow. As shown in FIG. 2, the process flow of a semiconductor substrate through process tools 20–26 is shown by a dotted line. The deposition system 20 may be used to deposit a nitride layer on a semiconductor substrate for use in defining active areas according to standard LOCOS techniques or shallow trench isolation techniques. In such a process step, a semiconductor substrate may have previously been processed by other process tools (not shown) to form a thin pad oxide layer upon the substrate. Typically, after deposition of the nitride layer, photolithography tools 22 may utilized to form a photoresist pattern, etch tools 24 may be utilized to etch the patterned nitride layer, and then cleaning tools 26 utilized to remove the photoresist and other residues. The semiconductor substrate is then ready for further processing. In operation, each of the tools 20–26 may be coupled to the logic based computer system 2 through data lines 6. Alternatively, a distributed computer system may be utilized with some or all of the tools being equipped with embedded logic-based computer systems. In use, the nitride thickness detected for the nitride layer formed by the deposition tool 20 is transmitted to the computer system 2. The thickness of the nitride layer is then utilized by the computer system 2 to adjust the photolithography exposure level in the photolithography tools 22 and the exposure control information is transmitted from the computer system 2 to the photolithography tools 22. The photolithography tools 22 may provide to the computer system 2 critical dimension (CD) information regarding the photoresist pattern obtained. The computer system 2 may then utilize both the nitride thickness information and critical dimension information to adjust the etch time of etch tools 24. The cleaning parameters utilized in the cleaning tools 26 may then be adjusted depending upon the selected etch time. The semiconductor substrate may then be forwarded on to other process tools (not shown) for further processing.

Because of the computational power of a logic based computer system, complex dependencies between numerous process variables and process results that may improve yield may be identified, and appropriate process adjustments may be made in real time. Such complex correlations may even include correlations currently unrecognized in the art. Thus, the examples shown herein are illustrative and it is expected that other correlations and dependencies between process variables will be increasingly identified after increasing use of such logic-based computer systems increases the available information database.

Though discussed above with respect to optimizing yield, the logic based computer system and data collection techniques may also be utilized to determine at which point it becomes unprofitable to continue processing a given wafer or lot. By analyzing the number of process steps remaining to complete a given wafer or lot (and the associated remaining costs of such steps) and the expected final yields, the control system may determine that further processing will not be profitable. Thus, the system may be utilized to determine when to "scrap" material in process.

An optional feature of the process control may be referred to as "process interlocks." These interlocks may be embedded in the process control system. The process interlocks notify the manufacturing personnel if a processing step is inappropriate or incorrect. For example, some process tools have an interlock capability to prevent mixing of two incompatible gases. The methods disclosed herein may include interlocks embedded in the process control system which activate if the process variables are such that the obtained thicknesses, critical dimensions, adhesion properties, step coverage, stress values and other physical, thermodynamic or electrical parameters will be undesirable. In this manner, processing operations which may cause undesirable effects may be automatically prevented. The embedded interlocks may also utilize the historical information database of a given wafer or lot so that processing may be halted before the undesirable effects are obtained.

Figure 4A:
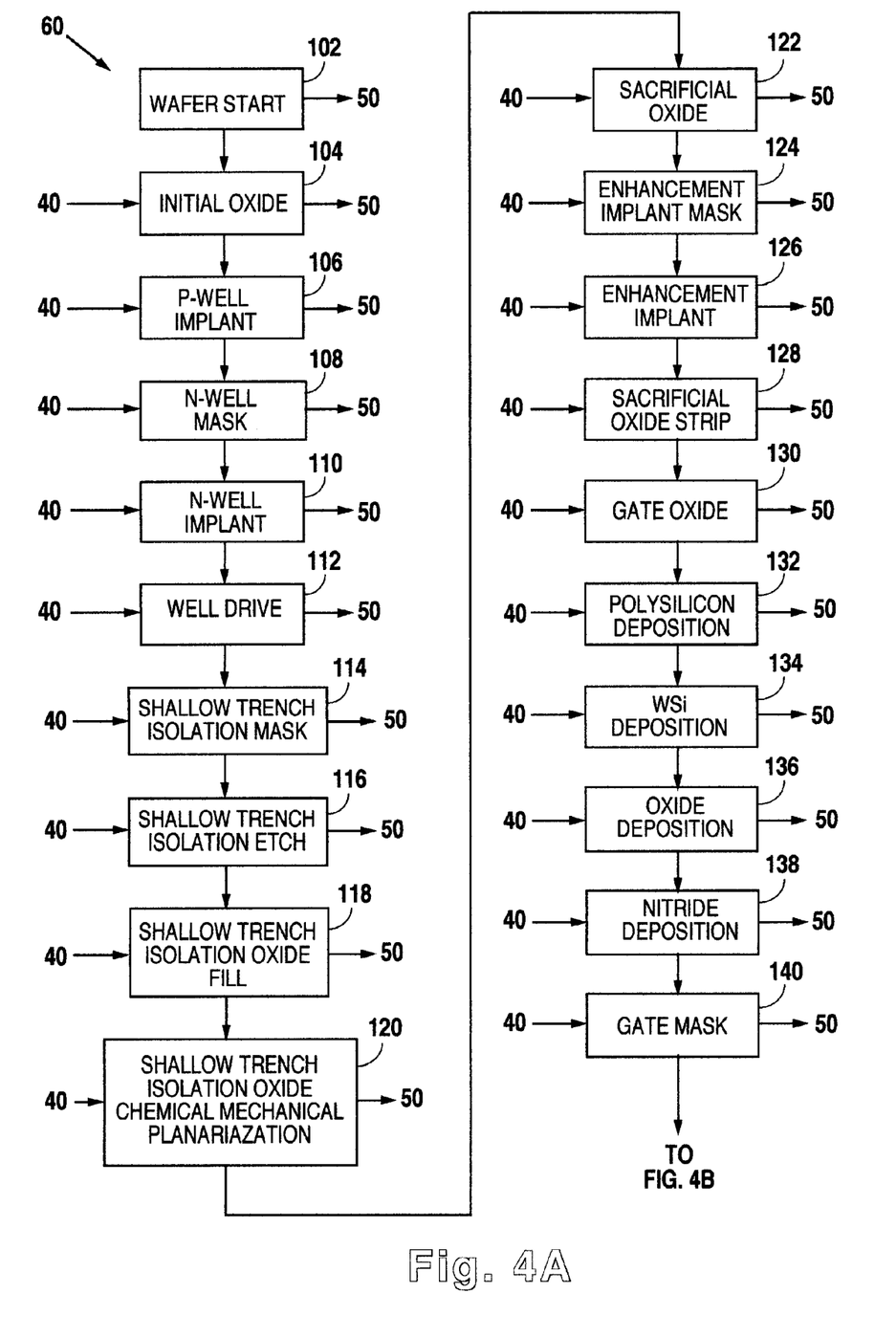
FIGS. 4A, 4B and 4C illustrate an exemplary process flow utilizing the control techniques disclosed herein.
Figure 4B:
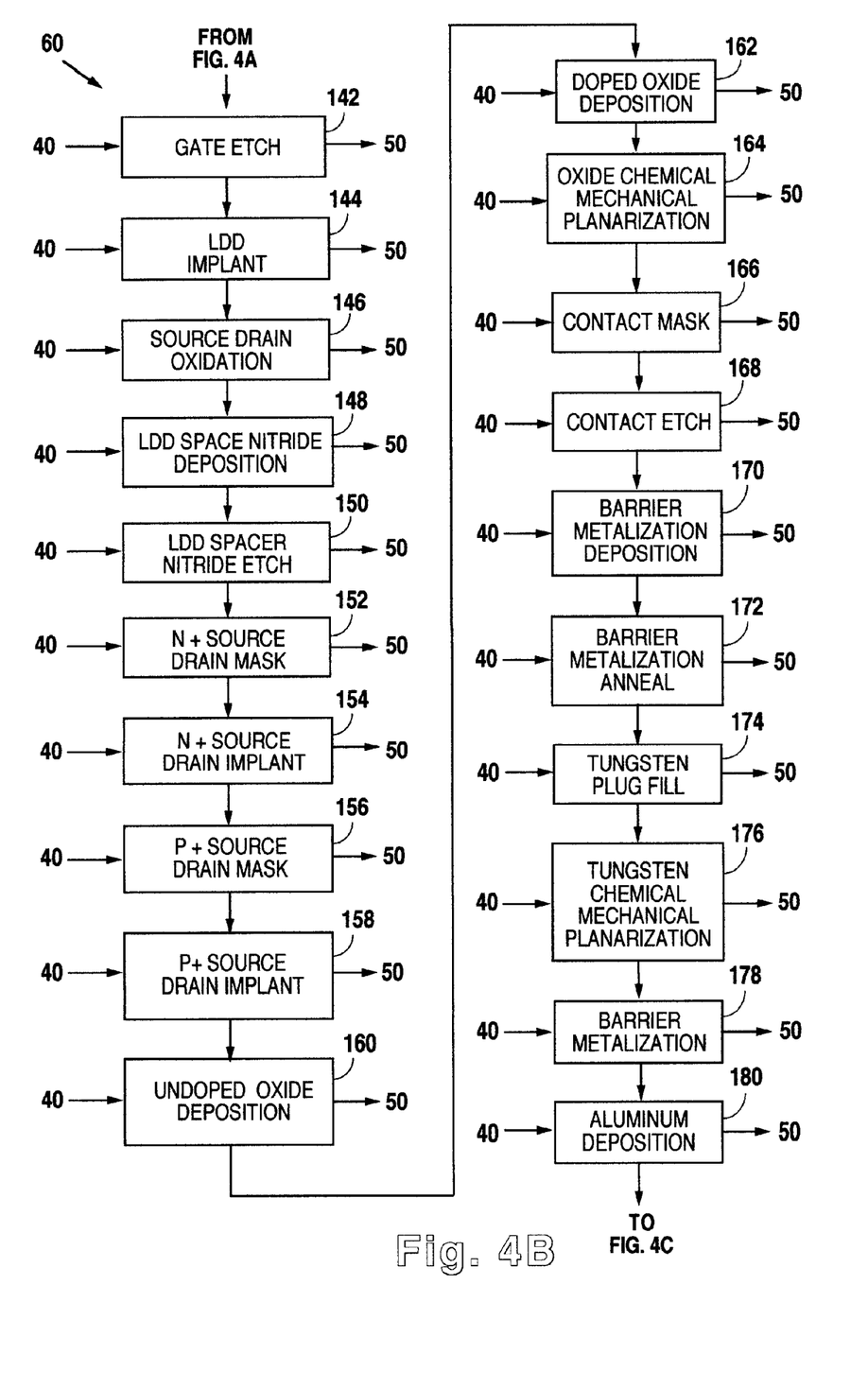
Figure 4C:
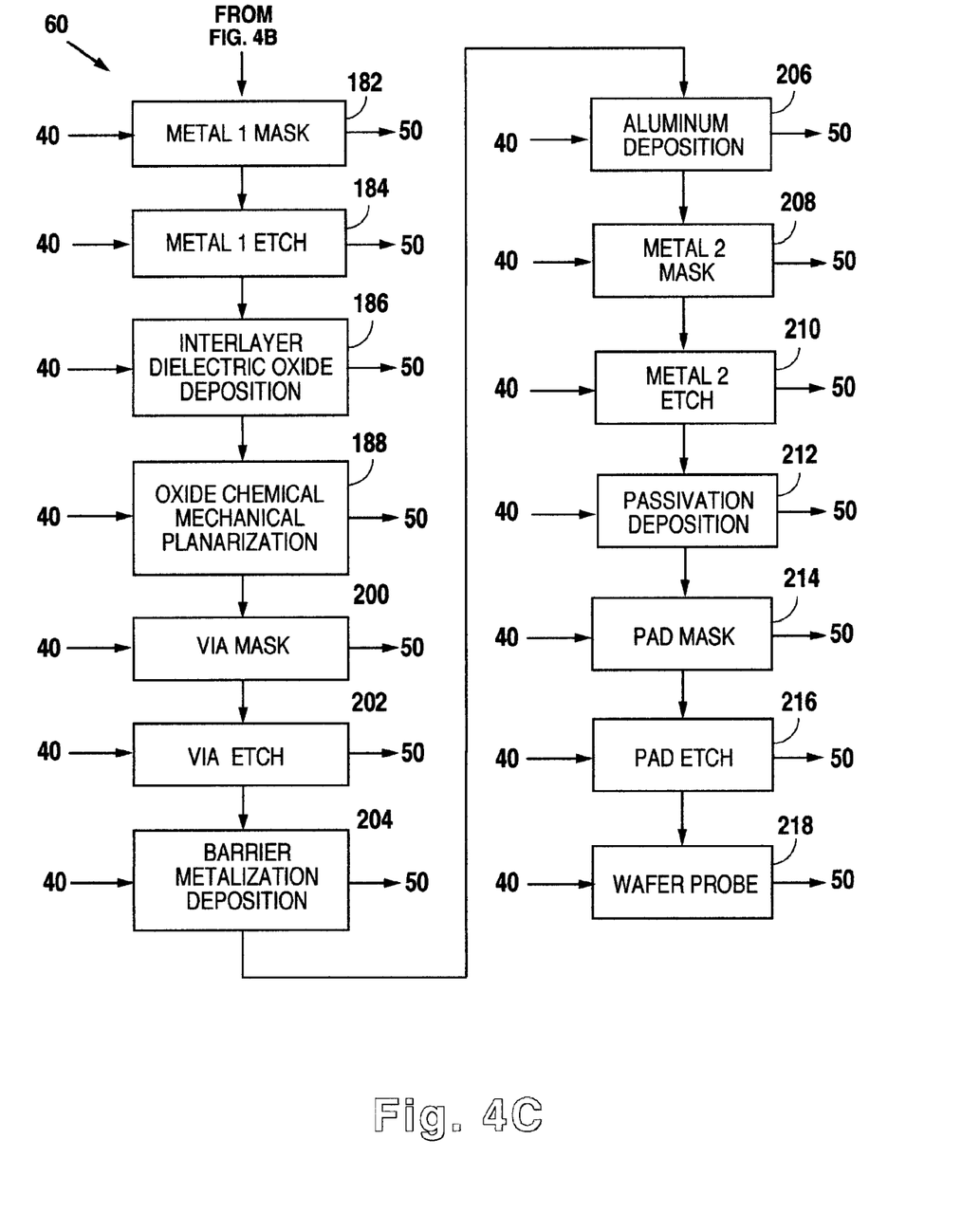

The techniques described above may be utilized for a wide variety of semiconductor manufacturing processes. FIGS. 4A–4C illustrate an exemplary process flow 60 of a semiconductor manufacturing process. The various steps of the process are shown as rectangular blocks 102 through 218. Process steps where information may be provided from the manufacturing equipment, analysis tools, etc. for entry into the informational database are shown as having data out information arrows 50. Process steps where information may be provided from the informational database and control system to the manufacturing equipment is shown as control information arrows 40. It will be recognized that the process flow 60 is merely an exemplary process flow and many process flows may be utilized with the techniques shown herein. Thus, the process flow 60 illustrates process steps or modules often common to a wide variety of manufacturing processes, such as for example process for manufacturing DRAM memory products, SRAM memory products, Flash memory products, logic products, microprocessor products, DSP products, etc. However, it will also be recognized that any specific manufacturing process may have additional steps or not include all of the steps of process flow 60 as dictated by the particular characteristics of the product being manufactured.

A variety of the major process steps or modules of the process flow 60 are shown in FIGS. 4A–4C. It will be recognized that numerous additional steps such as cleaning steps, photoresist removal steps, measurement steps, etc. will also be performed in addition to those listed. Further, the blocks shown as one step in FIGS. 4A–4C will be recognized to include a variety of steps. Thus, for example, a masking step may include photoresist coating, photoresist exposure, photoresist developing, photoresist baking, measurement of critical dimensions, etc. and a deposition step may include cleaning steps.

The control information 40 provided to each process step may include process recipes, control programs or other information necessary for performing the desired process step. The data out information 50 provided from each process step to the informational database may include any results or measurements collected at the particular process step and other information as described above. As mentioned above, the control information 40 for any particular process step for a particular wafer or group of wafers may be dependent upon the data out information 50 provided from process steps performed earlier in the process flow for the particular wafer or group of wafers. Further, the control information 40 for a particular process step may also be machine or process tool dependent such that the control information 40 provided to a specific process tool may be dependent upon the data out information 50 generated from previous operations of the specific process tool.

Examples of the use of the data out information 50 to adjust the control information 40 are discussed below with reference to the process step blocks 102–218 of FIGS. 4A–4C. The examples discussed herein are not meant to be exhaustive of all uses of the data provided to the informational database to generate control information, but rather, merely exemplary instances in which the techniques disclosed herein may be utilized. As shown in FIG. 4A, the initial process step of the process flow 60 may be the wafer start step 102. The data out information 50 for the wafer start step 102 may include wafer number, lot number, initial resistivity, oxygen content, wafer thickness, wafer flatness, etc. The data out information 50 collected at step 50 may be utilized to correlate final product yields to the collected data. At least some of the data may be utilized to affect the control information 40 of subsequent process steps. For example, the wafer thickness and wafer flatness data may be utilized to generate the control information 40 for one or more of the masking steps (for example, steps 108, 140, 166, etc.).

The next process steps may include the initial oxide formation step 104, a p-well implant step 106, an n-well mask step 108, an n-well implant 110, and a well drive step 112. The data out information 50 provided to the information database at initial oxide step 104 may include the oxide thickness. This oxide thickness may be utilized to adjust the control information provided to the implant steps 106 and 110. For example, the implant energy and/or dose may be fine tuned depending upon the initial oxide thickness. Implant doses, implant energy and test measurements from implant resistivity monitors may be provided in the data out information 50 for implant steps 106 and 110.

Isolation structures may be formed in the shallow trench isolation mask step 114, the shallow trench isolation etch 116, the shallow trench isolation oxide fill step 118 and the shallow trench isolation oxide chemical mechanical planarization step 120. Examples of the use of the informational database for such steps may include adjusting the control information 40 of the shallow trench isolation etch (for example main etch and overetch times) in response data out information 50 collected at the initial oxide step 104 and well drive step 112 (for example oxide thicknesses). The control information 40 for the planarization step 120 (including for example planarization polish time) may be dependent upon thickness data out information 50 provided from initial oxide step 104, well drive step 112, and shallow trench isolation oxide fill step 118.

Then, transistor Vt adjustments may be set through the use of the sacrificial oxide step 122, enhancement implant mask step 124, enhancement implant step 126 and sacrificial oxide strip step 128. The control information 40 for the enhancement implant step 126 may adjust the implant energy and dose in response to data out information 50 collected at the sacrificial oxide step 122 (for example oxide thickness data), p-well implant step 106 (for example implant dose and energy data), and n-well implant step 110 (for example implant dose and energy data).

Transistor gates may then be formed through the use of the polysilicon deposition step 132, the WSi deposition step 134, the oxide deposition step 136, the nitride deposition step 138, the gate mask step 140, and the gate etch step 142. In these steps the control information may be adjusted in a wide variety of manners. For example, the target WSi thickness in step 134 may be varied depending upon the polysilicon thickness obtained in step 132. Further, the control information 40 provided to the gate mask step 140 may include adjustments to the target critical dimensions depending upon the data out information 40 provided from the enhancement implant step 126 (for example implant energy and dose data) and from the gate oxide step 130 (for example the oxide thickness). Main etch and overetch times provided in the control information 40 for the gate etch step 142 may in turn be dependent upon thickness measurements provided as data out information 50 from steps 132, 134, 136, and 138 and upon the critical dimensions provided as data out information 50 from the gate mask step 140.

The control information 40 for the LDD (lightly doped drain) implant step 144 (for example target dose and energy data) may be dependent upon the data out information 50 from each previous implant steps and the critical dimensions provided as data outputs from the gate etch step 142.

Sidewalls may be formed on the sides of the transistor gates through the LDD spacer nitride deposition step 148 and the LDD spacer nitride etch 150. Control information 40 for the LDD spacer nitride etch step 150 may include main etch and overetch times. This control information may be dependent upon film thickness measurement data provided as data out information 50 from steps 146 and 148.

Heavily doped source and drain regions may then be formed through the N+ source drain mask step 152, the N+ source drain implant step 154, the P+ source drain mask step 156 and the P+ source drain implant step 158. Control information 40 (for example implant dose and energy) provided to implant steps 154 and 158 may be dependent upon data out information 50 (for example implant dose and energy data) from the LDD implant step 144.

A dielectric layer having contact openings may then be formed through the use of the undoped oxide deposition step 160, doped oxide deposition step 162, oxide chemical mechanical planarization step 164, contact mask step 166 and contact etch step 168. The control information 40 provided to the planarization step 164 may include polishing times that are dependent upon film thickness measurements provided as data out information 50 from the deposition steps 160 and 162. The control information 40 provided to the contact mask step 166 may include targets for alignment and critical dimensions that are dependent upon alignment and critical dimension data provided as data out information from the gate mask step 140 and the gate etch step 142. The control information 40 provided to the contact etch step 168 may include main etch and overetch times that are dependent upon alignment and critical dimension data provided as data out information 50 from contact mask step 166 and that are dependent upon film thickness measurements that are provided as data out information 50 from deposition steps 160 and 162.

A contact fill process may then be accomplished through the use of the barrier metalization deposition step 170, barrier metalization anneal step 172, tungsten plug fill step 174 and tungsten chemical mechanical planarization step 176. The control information 40 provided to the barrier metalization anneal step 172 may include anneal times that are dependent upon the film thickness and resistivity data provided as data out information 50 from the barrier metalization deposition step 170. Further, the film thickness of the tungsten deposited in the tungsten plug fill step 174 may be provided as data out information from that step and utilized to adjust the polish times provided as control information 40 for the planarization step 176.

A metalization layer may then be formed through the use of the barrier metalization deposition step 178, the aluminum deposition step 180, the metal 1 mask step 182, and the metal 1 etch step 184. The control information 40 provided to the metal 1 mask step 182 may include targets for alignment and critical dimensions that are dependent upon alignment and critical dimension data provided as data out information from the contact mask step 166 and the contact etch step 168. The control information 40 provided to the metal 1 etch step 184 may include main etch and overetch times that are dependent upon alignment and critical dimension data provided as data out information 50 from metal 1 mask step 182 and that are dependent upon film thickness measurements that are provided as data out information 50 from deposition steps 178 and 180.

An interlayer dielectric having vias may then be formed through the use of the interlayer dielectric oxide deposition step 186, the oxide chemical mechanical planarization step 188, the via mask step 200 and the via etch step 202. The control information 40 provided to the planarization step 188 may include polishing times that are dependent upon film thickness measurements provided as data out information 50 from the deposition step 186. The control information 40 provided to the via mask step 200 may include targets for alignment and critical dimensions that are dependent upon alignment and critical dimension data provided as data out information from the metal 1 mask step 182 and the metal 1 etch step 184. The control information 40 provided to the via etch step 202 may include main etch and overetch times that are dependent upon alignment and critical dimension data provided as data out information 50 from via mask step 200 and that are dependent upon film thickness measurements that are provided as data out information 50 from the deposition step 186.

A second metalization layer may then be formed through the use of the barrier metalization deposition step 204, the aluminum deposition step 206, the metal 2 mask step 208, and the metal 2 etch step 210. The control information 40 provided to the metal 2 mask step 208 may include targets for alignment and critical dimensions that are dependent upon alignment and critical dimension data provided as data out information from the via mask step 200 and the via etch step 202. The control information 40 provided to the metal 2 etch step 210 may include main etch and overetch times that are dependent upon alignment and critical dimension data provided as data out information 50 from metal 2 mask step 208 and that are dependent upon film thickness measurements that are provided as data out information 50 from the deposition steps 204 and 206.

After the formation of the second metalization layer, passivation layers and pad openings may be formed through the use of the passivation deposition step 212 (which may include an oxide deposition and a nitride deposition), the pad mask step 214, and the pad etch step 216. The pad mask step 214 may receive control information 40 which includes alignment information that is dependent upon the alignment data out information provided from metal 2 mask step 208. The control information 40 provided to the pad etch step 216 may include main etch and overetch times that are dependent upon film thickness measurements provided as data out information 50 from the passivation deposition step 212.

Finally, the process may include a test step such as wafer probe step 218. Though not shown in the process flow, additional testing generally will also be performed on each individual integrated circuit after wafer die cutting and die packaging. The data out information 50 from the test step may include various test outputs, test failures and test passing information obtained for each integrated circuit, wafer, and/or group of wafers. The informational database may then utilize and correlate the test data and the process data obtained from the various process steps in order to improve yields for a given process and/or aid in the design of a new process as described herein.

Design And Optimization Of New Processes

The data collection and analysis techniques described above may also be utilized for systematically developing new generations of semiconductor fabrication processes. More particularly, the informational database described above may be generated for an existing (or mature) technology (for example a 0.25 um fabrication process). This database may include, for example, the existing design rules, process steps, process variables, the effects of the process variables, six sigma statistical process limits for the process variables, and the effects of variations in the process variables on yield models and/or resulting actual yields.

The information database for the existing technology may then be utilized to design the next generation technology (for example a 0.15 um fabrication process). The design of the next generation process may begin by inputting into the informational database the initial design rules, process steps, process variables and target values for the process variables in the new process. The logic based computer system may then identify the common process steps, variables and limits between the mature and next generation processes. The logic based computer system may then calculate the expected effects of the variations between the process steps, variables and limits of the two processes based upon the accumulated knowledge regarding the mature process. The logic based computer system may then generate a statistical model for the next generation process and compute the expected yield shift for the next generation process.

After generation of the statistical model and expected yield shift, changes in the next generation process may be made by the logic based computer system to improve the expected yield shift. More particularly, the logic based computer system may adjust the process variables and limits to improve the expected yield and/or improve the process tolerances at one or more process steps to improve the robustness of the process. This adjustment process may be repeatedly or iteratively performed until the optimal yield is obtained. In this manner an optimal next generation process may be designed using a statistical simulation before the process is constructed. Thus, changes and optimization of the next generation process may be incorporated in the design stage of the next generation process rather than after the next generation process is constructed. In this manner the amount of process optimization based on after-the-fact analysis of processed (with the next generation process) wafers may be reduced.

Figure 3:
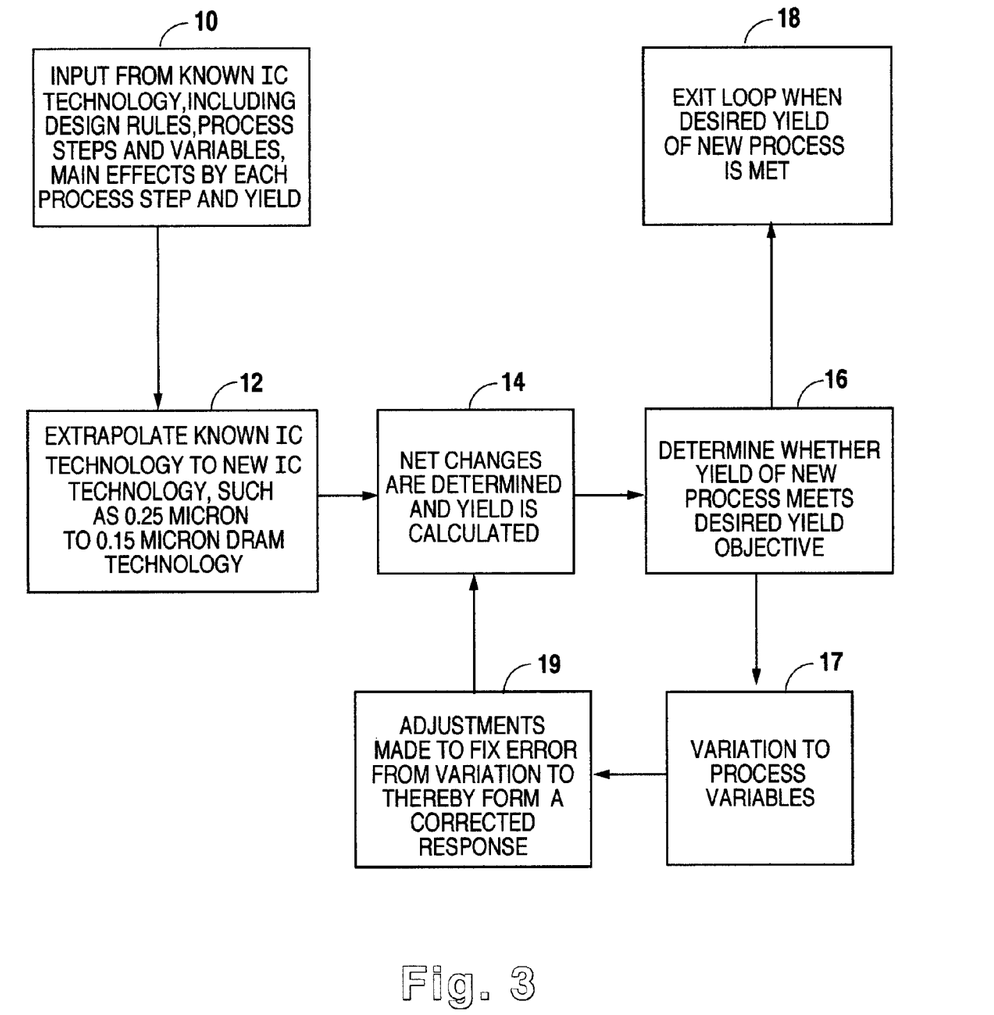
FIG. 3 is a flow diagram illustrating a method for developing a new generation of IC technology based upon known technology.

Referring to FIG. 3 there is shown a block diagram for transforming data from known or existing processes to new generations of IC technology based on the known technology. In this way for example, a mature technology in manufacturing such as 0.25 micron can be used, and adjustments can be made for 0.15 micron technology to maintain a yield of the new technology the same as in current manufacturing. The implementation of this method is preferred during the earlier stages of development of the new generation process, and in that way incorporates the issues at the design stage instead of waiting until an incorrect process flow is developed with the attendant experimental problems. In FIG. 3, input 10 from a known (mature) technology such as 0.25 micron technology is obtained, including design rules, process steps, process variables, main effects by each process step and yield as input factors. This input is extrapolated to new technology, such as 0.15 micron technology, in block 12. Each input factor is adjusted for variations that are needed in the new technology. By way of example, the system determines the variation needed to keep the yield the same when changing from known 130 Angstrom gate technology to less than 70 Angstrom gate technology. Thus, in block 14 all variations of process variables are determined and yield models are calculated. In block 16, a determination is made as to whether the process meets the desired yield, and if so the decision loop of FIG. 3 is halted at exit block 18. If it has been determined in block 16 that process does not meet the desired yield, then control passes to block 17. In block 17, variations are made to one or more process variables. In Block 19, adjustments may then be made to other process variables to compensate for any errors that may result from the changes made in block 17. Thus, in block 19 addition process variables may be changed. The control loop then returns to block 14 where the new manufacturing process yield is calculated again using the defined variations. The process is repeated until a desired yield is achieved.

The calculations, yield determinations, process variations selected, etc. within the control blocks 12, 14, 16, 17, and 19 may be performed by the logic based computer system by use of the informational database generated with respect to the existing or mature technology. In some methods, the relationship between yield and selected process parameters will fit into a polynomial, such as $Y(yield)=A_1+A_2X_1+A_3X_2^2+\ldots A_nX_{n-1}^{n-1}$ wherein the distribution of each term $A_nX_{n-1}$ is determined where $A_nX_{n-1}$ for a given process step is the acceptable variation ($f(x)$) of previous and future steps. In this manner, a statistical model may be used to empirically determine the optimal values for the process variables of the next generation process.

By utilizing the techniques shown herein, numerous advantages may be obtained when operating a semiconductor fabrication facility. For example, a reduced cycle time to develop and implement a new process may be obtained. Further the amount of scrap product may be reduced and yields on finished products may be improved. The techniques shown herein are particularly useful for process utilized to fabricate integrated circuits which are quickly converted from one generation to another. Thus, for example, memory products which must constantly be converted to more complex processes in a relatively rapid time span to remain cost competitive are particularly suited for the process control and design techniques shown herein. Such memory products include, for example, DRAM, SRAM, and Flash products. The present invention is not limited, however, to memory processes thus, the techniques disclosed herein may be useful for the manufacturing of a wide range of semiconductor products including, but not limited to, logic products, digital signal processors (DSP), microprocessors, telecommunication products, etc.

Further modifications and alternative embodiments of this invention will be apparent to those skilled in the art in view of this description. Accordingly, this description is to be construed as illustrative only and is for the purpose of teaching those skilled in the art the manner of carrying out the invention. It is to be understood that the forms of the invention herein shown and described are to be taken as illustrative embodiments. Equivalent elements or materials may be substituted for those illustrated and described herein, and certain features of the invention may be utilized independently of the use of other features, all as would be apparent to one skilled in the art after having the benefit of this description of the invention.

What is claimed is:

1. A method for the systematic development of integrated circuit technology, comprising:

obtaining existing data relating to process variables of an existing integrated circuit manufacture process to characterize the existing integrated circuit manufacturing process;

extrapolating, with a logic based computer system, the existing data to a new process technology to assess and calculate variations between the existing process and the new process;

determining potential yields of the new process and adjusting process variables of the new process to conform to a desired yield model through the use of the logic based computer system.

2. The method of claim 1, wherein the integrated circuit technology relates to DRAM technology.

3. The method of claim 1, wherein the process variables of the existing process of which existing data is collected is a sub-set of an entirety of the process variables of the existing process.

4. The method of claim 3, wherein the process variables of the new process which are adjusted are a sub-set of an entirety of the process variables of the new process.

5. A method for developing new integrated circuit fabrication technology, comprising:

(a) selecting a known integrated circuit fabrication process defined by a given set of design rules;

(b) identifying key process steps used in the known process;

(c) comparing the known process design rules with design rules for the new integrated circuit fabrication technology;

(d) preparing a statistical model for the new integrated fabrication technology;

(f) defining control limits on variations in the new integrated circuit fabrication technology based on the known process;

(g) computing shifts in yield in the new process due to potential variations in the process variables of the new integrated fabrication technology; and (h) adjusting the control limits to improve yield in the new integrated fabrication technology.

6. The method of claim 5, further comprising:

repeating a plurality of the steps of claim 5 to achieve the desired yield.

7. The method of claim 5 wherein control limits are defined, at least in part, on 6-sigma statistical limits of the known process.

8. The method of claim 5 wherein at least one step is performed through the use of a logic based computer system.

9. The method of claim 8, wherein the computer system includes fuzzy logic or a neural-network.

10. The method of claim 9, the new integrated circuit technology being used to manufacturer a memory device.

11. The method of claim 10, the memory device being a DRAM.

12. A process useful for the manufacture of an integrated circuit, comprising:

introducing a semiconductor substrate into a manufacturing line used to make an integrated circuit;

processing the substrate using process tools of the manufacturing line;

obtaining first process data relating to the processing of the first substrate through at least a first process tool;

identifying variations in the first process data as compared to desired first process data; and automatically adjusting through a logic based computer system one or more process variables of at least a first downstream process tool in order to compensate for the identified variation.

13. The process of claim 12, further comprising automatically adjusting through a logic based computer system one or more process variables of at least a second downstream process tool.

14. The process of claim 12, further comprising:

obtaining second process data relating to the processing of the first substrate through at least a second process tool;

identifying variations in the second process data as compared to desired process data;

automatically adjusting through a logic based computer system one or more process variables of at least a first downstream process tool in order to compensate for the identified variations in the first process data and the second process data.

15. The process of claim 14, further comprising automatically adjusting through a logic based computer system one or more process variables of at least a second downstream process tool.

16. The process of claim 15, the integrated circuit being a memory device.

17. A system useful for manufacturing an integrated circuit, comprising:

(a) a plurality of process tools used in making the integrated circuit;

(b) a logic based computer system and process control software installed in or coupled to each manufacturing tool, the computer system and control software monitoring and controlling the operation of at least some of the tools, wherein process variables of a plurality of downstream process tools are automatically adjusted by the computer system and control software to improve integrated circuit yield based on a comparison of previously obtained process variables occurring from one or more upstream process tools; and (c) lines for networking the computer system to a plurality of the process tools.

18. The system of claim 17, the computer system comprising a fuzzy logic computer system.

19. The system of claim 17, the computer system being a distributed computer system.

20. The system of claim 17, the computer system being a centralized computer system.

21. The system of claim 17, the computer system comprising a neural-network computer system.

* * * * *